United States Patent
Baek et al.

(10) Patent No.: US 9,640,673 B2
(45) Date of Patent: May 2, 2017

(54) SOLAR CELL AND MANUFACTURING METHOD THEREOF

(71) Applicant: LG ELECTRONICS INC., Seoul (KR)

(72) Inventors: Hayan Baek, Seoul (KR); Junghoon Choi, Seoul (KR); Goohwan Shim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 114 days.

(21) Appl. No.: 14/295,662

(22) Filed: Jun. 4, 2014

(65) Prior Publication Data

US 2014/0360570 A1 Dec. 11, 2014

(30) Foreign Application Priority Data

Jun. 5, 2013 (KR) ........................ 10-2013-0064788

(51) Int. Cl.
*H01L 31/18* (2006.01)
*H01L 31/0224* (2006.01)
*H01L 31/068* (2012.01)
*H01L 31/072* (2012.01)

(52) U.S. Cl.
CPC ............... *H01L 31/022425* (2013.01); *H01L 31/022441* (2013.01); *H01L 31/068* (2013.01); *H01L 31/0682* (2013.01); *H01L 31/072* (2013.01); *H01L 31/18* (2013.01); *H01L 31/1804* (2013.01); *Y02E 10/547* (2013.01); *Y02P 70/521* (2015.11)

(58) Field of Classification Search
CPC ................ H01L 31/022425; H01L 31/022441
See application file for complete search history.

(56) References Cited

U.S. PATENT DOCUMENTS

2004/0200520 A1* 10/2004 Mulligan ........ H01L 31/022441
136/256
2011/0041911 A1* 2/2011 Lee ................. H01L 31/022425
136/256
2011/0309508 A1 12/2011 Cabral, Jr. et al.
(Continued)

FOREIGN PATENT DOCUMENTS

JP          2006-523025 A    10/2006
KR   10-2011-0018648 A     2/2011
KR   10-2011-0032655 A     3/2011

*Primary Examiner* — Robert Vetere
(74) *Attorney, Agent, or Firm* — Dentons US LLP

(57) ABSTRACT

The manufacturing method of a solar cell includes forming a photoelectric conversion unit and forming an electrode connected to the photoelectric conversion unit. The step of forming the electrode includes forming a seed formation layer connected to the photoelectric conversion unit, forming an anti-oxidation layer on the seed formation layer, performing a thermal process such that a material of the seed formation layer and a material of the photoelectric conversion unit react with each other to form a chemical bonding layer at a portion at which the seed formation layer and the photoelectric conversion unit are adjacent to each other, forming a conductive layer and a capping layer on the seed formation layer in a state in which a mask is used on the seed formation layer, and patterning the seed formation layer using either the conductive layer or the capping layer as a mask.

17 Claims, 7 Drawing Sheets

(56) References Cited

U.S. PATENT DOCUMENTS

2012/0129049 A1* 5/2012 Rayner ............... C22C 21/02
429/220
2013/0061917 A1* 3/2013 Huang ............ H01L 31/022425
136/256

* cited by examiner

US 9,640,673 B2

SOLAR CELL AND MANUFACTURING METHOD THEREOF

CROSS-REFERENCE TO RELATED APPLICATION

This application claims the priority benefit of Korean Patent Application No. 10-2013-0064788, filed on Jun. 5, 2013 in the Korean Intellectual Property Office, the disclosure of which is incorporated by reference for all purposes as if fully set forth herein.

BACKGROUND

1. Field of the disclosure

The present disclosure relates to a solar cell and a manufacturing method thereof and, more particularly, to a solar cell having electrodes each including a plurality of metal layers and a manufacturing method thereof.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

These solar cells may be fabricated via formation of various layers and electrodes with optional designs. The design of various layers and electrodes may determine the efficiency of a solar cell. Low efficiency of a solar cell must be overcome in order to commercialize the solar cell. Therefore, it is necessary to design various layers and electrodes of a solar cell such that the characteristics and efficiency of the solar cell can be maximized.

SUMMARY OF THE DISCLOSURE

It is an object of the present disclosure to provide a solar cell having improved characteristics and efficiency and a manufacturing method thereof.

In accordance with an aspect of the present invention, the above and other objects can be accomplished by the provision of a manufacturing method of a solar cell including forming a photoelectric conversion unit and forming an electrode connected to the photoelectric conversion unit. The step of forming the electrode includes forming a seed formation layer connected to the photoelectric conversion unit, forming an anti-oxidation layer on the seed formation layer to prevent oxidation of the seed formation layer, performing a thermal process such that a material of the seed formation layer and a material of the photoelectric conversion unit react with each other to form a chemical bonding layer at a portion at which the seed formation layer and the photoelectric conversion unit are adjacent to each other, forming a conductive layer and a capping layer on the seed formation layer in a state in which a mask is disposed on the seed formation layer, and patterning the seed formation layer using one selected from between the conductive layer and the capping layer as a mask.

In accordance with another aspect of the present invention, there is provided a solar cell including a photoelectric conversion unit, an electrode including a chemical bonding layer adjacent to the photoelectric conversion unit, a seed layer formed on the chemical bonding layer, a conductive layer formed on the seed layer, and a capping layer formed on the conductive layer, and an anti-oxidation layer disposed between the chemical bonding layer and the conductive layer to prevent oxidation of the seed layer. The anti-oxidation layer includes at least one of titanium (Ti), tantalum (Ta), tungsten (W), molybdenum (Mo), chromium (Cr), zinc (Zn), an alloy containing at least one thereof, and nitride containing at least one thereof.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1A:
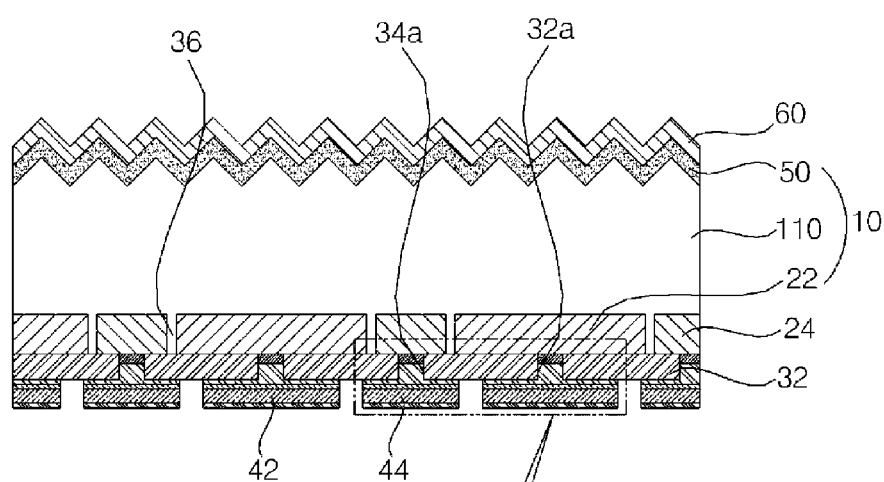
FIGS. 1A and 1B are sectional views showing a solar cell according to an exemplary embodiment of the present invention.

Reference will now be made in detail to the preferred embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell according to an embodiment of the present invention and a manufacturing method thereof will be described in detail with reference to the accompanying drawings.

FIG. 1A is a sectional view showing a solar cell according to an exemplary embodiment of the present invention.

Referring to FIG. 1A, a solar cell 100 according to an embodiment of the present invention includes a semiconductor substrate 10 and a photoelectric conversion unit including first and second conductive regions 22 and 24 respectively formed at the semiconductor substrate 10. The solar cell 100 may further include first and second electrodes 42 and 44 respectively connected to the photoelectric conversion unit (more specifically, the first and second conductive regions 22 and 24). In addition, the solar cell 100 may further include a passivation film 32, a front surface field layer 50, and an anti-reflection film 60. These components of the solar cell 100 will hereinafter be described in more detail.

More specifically, the semiconductor substrate 10 may include a base region 110 doped with a relatively low concentration of a dopant. The base region 110 may include various semiconductor materials. For example, the base region 110 may include silicon containing a second conductive dopant. The silicon may be single crystal silicon or polycrystalline silicon. The second conductive dopant may be, for example, an n-type dopant. That is, the base region 110 may be formed of single crystal or polycrystalline silicon including a group-V element, such as phosphorus (P), arsenic (As), bismuth (Bi), or antimony (Sb). However, the present invention is not limited thereto. For example, the base region 110 may be of a p-type.

The front surface of the semiconductor substrate 10 may be a textured surface provided with a concavo-convex shape, such as a pyramidal shape. The textured front surface of the semiconductor substrate 10, provided with the concavo-convex shape, may attain increased surface roughness, which may reduce reflectance of incident light upon the front surface of the semiconductor substrate 10. Consequently, the quantity of light reaching a tunnel junction formed by the base region 110 and a second conductive region 22 may be increased, whereby light loss of the solar cell 100 may be minimized.

The back surface of the semiconductor substrate 10 may be a relatively smooth and flat surface having lower surface roughness than the front surface of the semiconductor substrate 10 by mirror polishing. As a result, light transmitted through the semiconductor substrate 10 and directed to the back surface of the semiconductor substrate 10 may be reflected by the back surface of the semiconductor substrate 10 such that the light is directed back to the semiconductor substrate 10. For this reason, the back surface of the semiconductor substrate 10 is not textured. That is, no concavo-convex shape is formed at the back surface of the semiconductor substrate 10. However, the present invention is not limited thereto. Various other modifications are also possible.

Meanwhile, the front surface field layer 50 may be formed at the front surface of the semiconductor substrate 10. The front surface field layer 50 is a region doped with a higher concentration of a dopant than the base region 110. The front surface field layer 50 has a similar function to a general back surface field (BSF) layer. That is, the front surface field layer 50 prevents recombination and disappearance of electrons and holes, which have been separated from each other by incident solar light, at the front surface of the semiconductor substrate 10.

The anti-reflection film 60 may be formed on the front surface field layer 50. The anti-reflection film 60 may be formed over the entire front surface of the semiconductor substrate 10. The anti-reflection film 60 reduces reflectance of incident light upon the front surface of the semiconductor substrate 10 and serves to passivate defects present in the surface or bulk of the front surface field layer 50.

Through reduction in the reflectance of incident light upon the front surface of the semiconductor substrate 10, the quantity of light reaching a p-n junction may be increased. As a result, short-circuit current Isc of the solar cell 100 may be increased. In addition, passivation of defects may remove a recombination site of a minority carrier, which may increase open-circuit voltage Voc of the solar cell 100. In this way, the anti-reflection film 60 may increase the open-circuit voltage and the short-circuit current of the solar cell 100, thereby improving the conversion efficiency of the solar cell 100.

The anti-reflection film 60 may be formed of various materials. For example, the anti-reflection film 60 may have a single film structure or a multi-layer film structure formed of at least one selected from a group consisting of silicon nitride, silicon nitride containing hydrogen, silicon oxide, silicon oxide nitride, $MgF_2$, $ZnS$, $TiO_2$, and $CeO_2$. However, the present invention is not limited thereto. For example, the anti-reflection film 60 may be formed of various other materials.

The p-type first conductive region 22 and the n-type second conductive region 24, which contain different conductive dopants, are formed at the back surface of the semiconductor substrate 10. The first conductive region 22 and the second conductive region 24 may be spaced apart from each other in a state in which an isolation region 36 is disposed therebetween to prevent the occurrence of a shunt between the first conductive region 22 and the second conductive region 24. The first conductive region 22 and the second conductive region 24 may be spaced apart from each other by a predetermined distance (for example, several tens of μm to several hundreds of μm) due to the isolation region 36. However, the present invention is not limited thereto. For example, the first conductive region 22 and the second conductive region 24 may be in contact with each other. In addition, the first conductive region 22 and the second conductive region 24 may have the same thicknesses or different thicknesses. The present invention is not limited to the above-defined distance between the first and second conductive regions 22 and 24 and the above-defined thickness of the first and second conductive regions 22 and 24.

The first conductive region 22 may be formed by doping a first conductive dopant, e.g. a p-type dopant. On the other hand, the second conductive region 24 may be formed by doping a second conductive dopant, e.g. an n-type dopant. A group-III element, such as boron (B), gallium (Ga), or Indium (In), may be used as the p-type dopant. On the other hand, a group-V element, such as phosphorus (P), arsenic (As), or antimony (Sb), may be used as the n-type dopant. Doping may be performed using various methods, such as ion injection and thermal diffusion.

In this embodiment, the first and second conductive regions 22 and 24 are formed by doping. However, the present invention is not limited thereto. For example, a layer formed of amorphous silicon containing a p-type dopant and a layer formed of amorphous silicon containing an n-type dopant may be formed at the back surface of the semiconductor substrate 10 to form the first and second conductive regions 22 and 24. In addition, the first and second conductive regions 22 and 24 may be formed using various other methods.

The area of the first conductive region 22, which is a p-type region, may be greater than that of the second conductive region 24, which is an n-type region. In this embodiment, a carrier is collected only at the back surface of the semiconductor substrate 10. As a result, the length of the semiconductor substrate 10 in a horizontal direction is greater than the thickness of the semiconductor substrate 10. However, holes move slower than electrons. In consideration of this property, therefore, the area of the first conductive region 22, which is the p-type region, may be greater than that of the second conductive region 24, which is the n-type region.

The passivation film 32 may be formed at the back surface of the semiconductor substrate 10 while covering the first and second conductive regions 22 and 24. For example, the passivation film 32 may include at least one selected from a group consisting of silicon oxide, silicon nitride, silicon oxide nitride, aluminum oxide, hafnium oxide, zirconium oxide, $MgF_2$, ZnS, $TiO_2$, and $CeO_2$.

The first electrode 42 may be connected to the first conductive region 22 via a first contact hole 32a formed through the passivation film 32. On the other hand, the second electrode 44 may be connected to the second conductive region 24 via a second contact hole 34a formed through the passivation film 32. Each of the first and second electrodes 42 and 44 may be formed by stacking a plurality of layers such that various characteristics of the first and second electrodes 42 and 44 can be improved. The stack structure of the first and second electrodes 42 and 44 will hereinafter be described in detail.

Figure 1B:
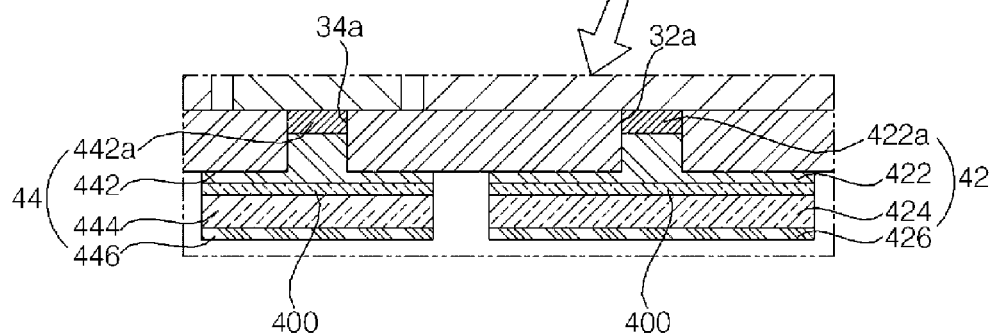

Referring to FIG. 1B, the first electrode 42 may include a chemical bonding layer 422a, a seed layer 422, a conductive layer 424, and a capping layer 426 sequentially formed on the photoelectric conversion unit (more specifically, the first conductive region 22). On the other hand, the second electrode 44 may include a chemical bonding layer 442a, a seed layer 442, a conductive layer 444, and a capping layer 446 sequentially formed on the photoelectric conversion unit (more specifically, the second conductive region 24). Between the seed layers 422 and 442 and the conductive layers 424 and 444 may be disposed an anti-oxidation layer 400 to prevent oxidation of the seed layers 422 and 442.

The chemical bonding layers 422a and 442a are in contact with the first and second conductive regions 22 and 24, respectively. The chemical bonding layers 422a and 442a may include a compound formed as a result of reaction between a metal constituting the seed layers 422 and 442 and a semiconductor material constituting the first and second conductive regions 22 and 24. For example, when the material or element of the seed layers 422 and 442 is applied to the semiconductor substrate 10 and a thermal process is performed, the semiconductor material of the first and second conductive regions 22 and 24 and the material or element of the seed layers 422 and 442 react with each other to form a compound. As a result, the chemical bonding layers 422a and 442a are formed from the compound.

For example, the seed layers 422 and 442 may include metal, such as nickel (Ni). The chemical bonding layers 422a and 442a may include nickel silicide (NiSi) formed as a result of reaction between the metal of the seed layers 422 and 442 and Si of the semiconductor substrate 10. As a result, it is possible to use excellent characteristics of NiSi of the chemical bonding layers 422a and 442a.

The chemical bonding layers 422a and 442a including NiSi have a low contact resistance with silicon of 2.8 to 2.95 $\Omega/\square$. In addition, the chemical bonding layers 422a and 442a have low thermal stress and thus excellent thermal stability and high contact force. In addition, when silicide is formed, an amount of silicon consumed is small and surface roughness and reflectance may be controlled.

The seed layers 422 and 442 including Ni cover the chemical bonding layers 422a and 442a to prevent the occurrence of a problem which may be caused when the chemical bonding layers 422a and 442a are not formed. That is, during the manufacturing process, the chemical bonding layers 422a and 442a may have a small thickness or a portion at which the chemical bonding layers 422a and 442a are absent may be formed due to an error. Contact resistance may be increased at the portion or the material of the conductive layers 424 and 444 may be diffused toward the semiconductor substrate 10. As a result, electrical characteristics may be lowered or a shunt may occur according to circumstances. In this embodiment, the seed layers 422 and 442 are formed while covering the chemical bonding layers 422a and 442a to prevent the occurrence of a problem which may be caused due to the increase of contact resistance, metal diffusion, etc.

In addition, the chemical bonding layers 422a and 442a and the seed layers 422 and 442 have lattice mismatches. Also, bonding energy between the seed layers 422 and 442 and the conductive layers 424 and 444 (for example, copper (Cu)) is high. While the metal of the conductive layers 424 and 444 is directed to the semiconductor substrate 10 via the seed layers 422 and 442 and the chemical bonding layers 422a and 442a, a double barrier may be formed. That is, the chemical bonding layers 422a and 442a and the conductive layers 424 and 444 form a double diffusion preventing structure to effectively prevent diffusion of the metal of the conductive layers 424 and 444 to the semiconductor substrate 10.

In this embodiment, the layer including Ni is formed and a thermal process is performed to form the chemical bonding layers 422a and 442a including NiSi at the lower part thereof while the seed layers 422 and 442 including Ni is disposed on the chemical bonding layers 422a and 442a. Consequently, it is not necessary to perform an additional process of forming the seed layers 422 and 442 on the chemical bonding layers 422a and 442a. As a result, it is possible to form the chemical bonding layers 422a and 442a including NiSi and the seed layers 422 and 442 including Ni through a simplified process.

For example, the chemical bonding layers 422a and 442a may be thicker than the seed layers 422 and 442. When the chemical bonding layers 422a and 442a are formed to have a relatively large thickness as described above, it is possible to improve junction characteristics of the first electrode 42 due to low contact resistance, excellent thermal stability, high contact force, etc. However, the present invention is not limited thereto. For example, the seed layers 422 and 442 may be thicker than the chemical bonding layers 422a and 442a.

The anti-oxidation layer 400 formed on the seed layers 422 and 442 may serve as a sacrificial oxide to prevent oxidation of the seed layers 422 and 442 when the chemical bonding layers 422a and 442a are formed through thermal process. In addition, the anti-oxidation layer 400 may serve as a diffusion barrier to prevent diffusion of metal into the seed layers 422 and 442 while the conductive layers 424 and 444 and the capping layers 426 and 446 are formed. For example, the anti-oxidation layer 400 may include metal or nitride containing a metal element. The metal may be provided in an oxidized state. For example, the anti-oxidation layer 400 may include titanium (Ti), tantalum (Ta), tungsten (W), molybdenum (Mo), chromium (Cr), zinc (Zn), an alloy containing at least one thereof, or nitride or oxide containing at least one thereof. In a case in which the anti-oxidation layer 400 is formed of metal, the first and second electrodes 42 and 44 may be formed through a common manufacturing process (for example, sputtering) while electrical conductivity of the first and second electrodes 42 and 44 is not lowered.

The conductive layers 424 and 444 formed on the anti-oxidation layer 400 may be formed of a metal material having high electrical conductivity. The conductive layers 424 and 444 are the thickest portions of the first electrode 42 (that is, the conductive layers 424 and 444 are thicker than the chemical bonding layers 422a and 442a, the seed layers 422 and 442, and the capping layers 426 and 446). Consequently, the conductive layers 424 and 444 may include a material which exhibits high electrical conductivity and is inexpensive. For example, the conductive layers 424 and 444 may include copper (Cu). However, the present invention is not limited thereto. For example, the conductive layers 424 and 444 may include silver (Ag) or gold (Au).

The capping layers 426 and 446 formed on the conductive layers 424 and 444 are provided to improve junction characteristics with a ribbon, etc. and to protect the conductive layers 424 and 444. The capping layers 426 and 446 may include tin (Sn) or tantalum nitride (TaN). In addition, in this embodiment, the capping layers 426 and 446 may serve as a mask when the seed layers 422 and 442, the chemical bonding layers 422*a* and 442*a*, and anti-oxidation layer 400 are selective etched, which will hereinafter be described in more detail.

In the figures, the conductive layers 424 and 444 and the capping layers 426 and 446 are shown as each including a single layer formed on the seed layers 422 and 442. Alternatively, the conductive layers 424 and 444 and/or the capping layers 426 and 446 may each include two or more layers. In addition, the conductive layers 424 and 444 and the capping layers 426 and 446 may constitute a signal layer including the same material. In this way, at least one metal layer may be provided on the seed layers 422 and 442.

A method of forming the first and second electrodes 42 and 44 with the above-stated construction and a method of manufacturing a solar cell 100 including the same will hereinafter be described in more detail with reference to FIGS. 2A to 2F and 3A to 3F. Hereinafter, a repeated description will be omitted and only difference will be described.

FIGS. 2A to 2F are sectional views showing a manufacturing method of a solar cell according to an exemplary embodiment of the present invention and FIGS. 3A to 3F are sectional views showing a method of forming first and second electrodes of a solar cell according to an exemplary embodiment of the present invention.

Figure 2A:
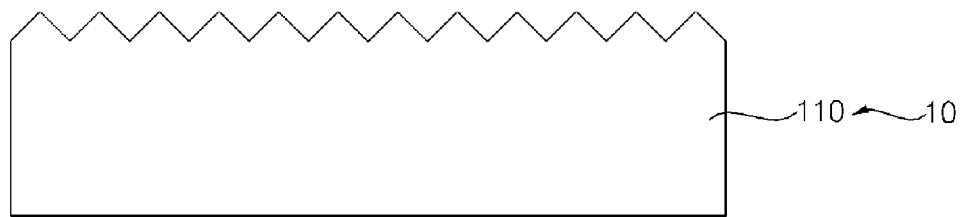
FIGS. 2A to 2F are sectional views showing a manufacturing method of a solar cell according to an exemplary embodiment of the present invention.

First, as shown in FIG. 2A, a semiconductor substrate 10 including a base region 110 containing a first conductive dopant is prepared. In this embodiment, the semiconductor substrate 10 may be formed of silicon containing an n-type dopant. A group-V element, such as phosphorus (P), arsenic (As), bismuth (Bi), or antimony (Sb), may be used as the n-type dopant.

At this time, the front surface of the semiconductor substrate 10 may be textured such that the front surface of the semiconductor substrate 10 has a concavo-convex shape. The back surface of the semiconductor substrate 10 may be mirror-polished to have lower surface roughness than the front surface of the semiconductor substrate 10. The front surface of the semiconductor substrate 10 may be textured using wet texturing or dry texturing. In the wet texturing, the semiconductor substrate 10 is soaked in a texturing solution. The wet texturing has an advantage in that process time is short. In the dry texturing, on the other hand, the surface of the semiconductor substrate 10 is cut using a diamond grill or laser. In the dry texturing, a concavo-convex shape is uniformly formed. However, process time is long and the semiconductor substrate 10 may be damaged. Alternatively, the semiconductor substrate 10 may be textured using reactive ion etching (RIE), etc. In this way, the semiconductor substrate 10 may be textured using various methods. In addition, the back surface of the semiconductor substrate 10 may be processed through mirror polishing.

Figure 2B:
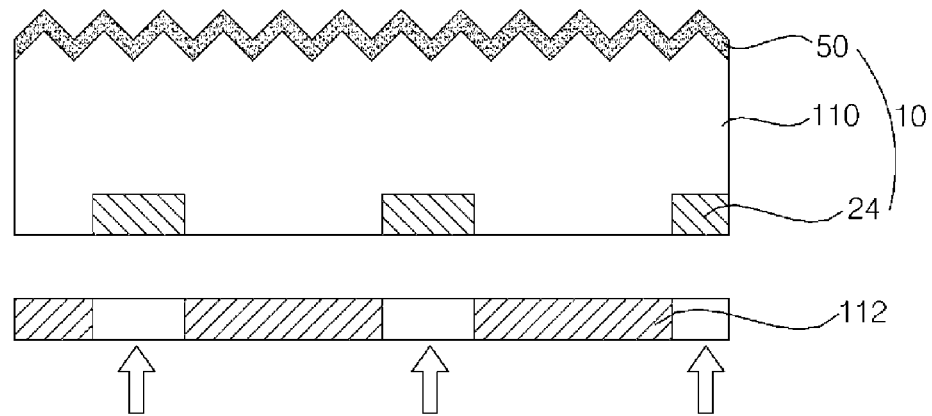

Subsequently, as shown in FIG. 2B, the semiconductor substrate 10 may be doped with an n-type dopant to form a second conductive region 24 and a front surface field layer 50. More specifically, an n-type dopant may be ion-injected into the front surface of the semiconductor substrate 10 to form a front surface field layer 50 and an n-type dopant may be ion-injected into a portion of the back surface of the semiconductor substrate 10 using a first mask 112 to form a second conductive region 24.

However, the present invention is not limited thereto. For example, a step of forming the second conductive region 24 and a step of forming the front surface field layer 50 may be separately performed using the same method or different methods. In addition, the second conductive region 24 and/or the front surface field layer 50 may be formed using methods other than ion injection.

Figure 2C:
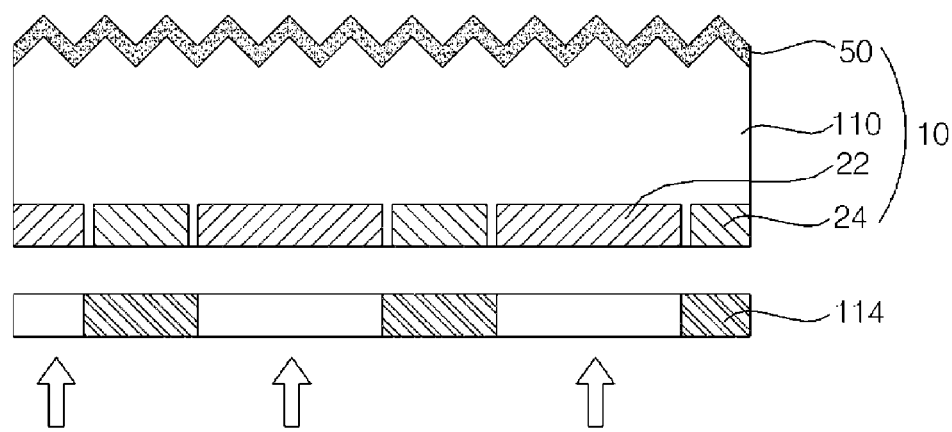

Subsequently, as shown in FIG. 2C, the semiconductor substrate 10 may be doped with a p-type dopant to form a first conductive region 22 at a portion at which the second conductive region 24 is not formed. More specifically, in a state in which a second mask 114 open at a portion thereof corresponding to first conductive region 22 is placed at the back surface of the semiconductor substrate 10, a p-type dopant may be ion-injected into the back surface of the semiconductor substrate 10 to form a first conductive region 22.

However, the present invention is not limited thereto. For example, the first conductive region 22 may be formed using methods other than ion injection.

When the first and second conductive regions 22 and 24 are formed through ion injection using the first and second masks 112 and 114 as in this embodiment, it is possible to accurately form the first and second conductive regions 22 and 24 having specific patterns using a simple process. At this time, the first and second conductive regions 22 and 24 may be formed through an in-line process in a vacuum state to prevent injection of any unnecessary dopant. However, the present invention is not limited thereto.

Figure 2D:
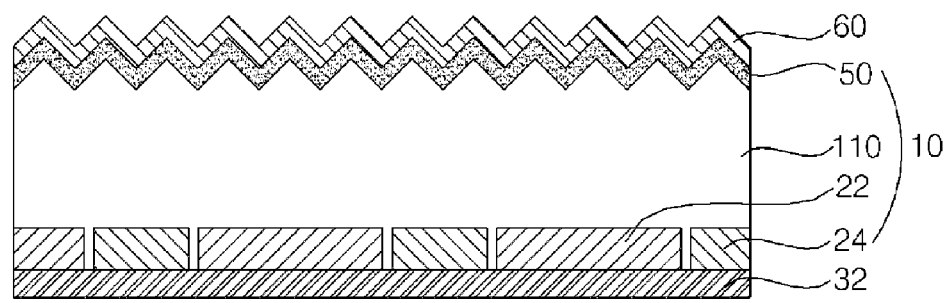

Subsequently, as shown in FIG. 2D, an anti-reflection film 60 and a passivation film 32 are formed. More specifically, the anti-reflection film 60 is formed over the entire front surface of the semiconductor substrate 10 and the passivation film 32 is formed over the entire back surface of the semiconductor substrate 10. When the passivation film 32 and the anti-reflection film 60 are simultaneously formed as described, the process may be simplified and productivity may be improved.

However, the present invention is not limited thereto. For example, a step of forming the anti-reflection film 60 and a step of forming the passivation film 32 may be separately performed using the same method or different methods.

The anti-reflection film 60 and the passivation film 32 may be formed using various methods, such as vacuum deposition, chemical vapor deposition, spin coating, screen printing, and spray coating.

Figure 2E:
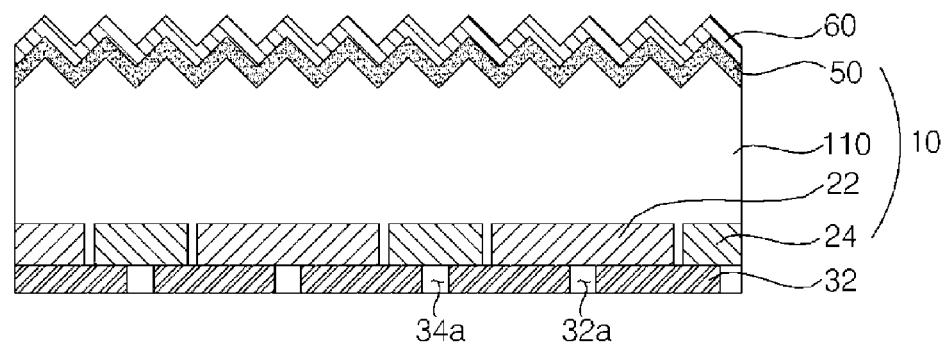

Subsequently, as shown in FIG. 2E, first and second contact holes 32*a* and 34*a* are formed through the passivation film 32.

Figure 2F:
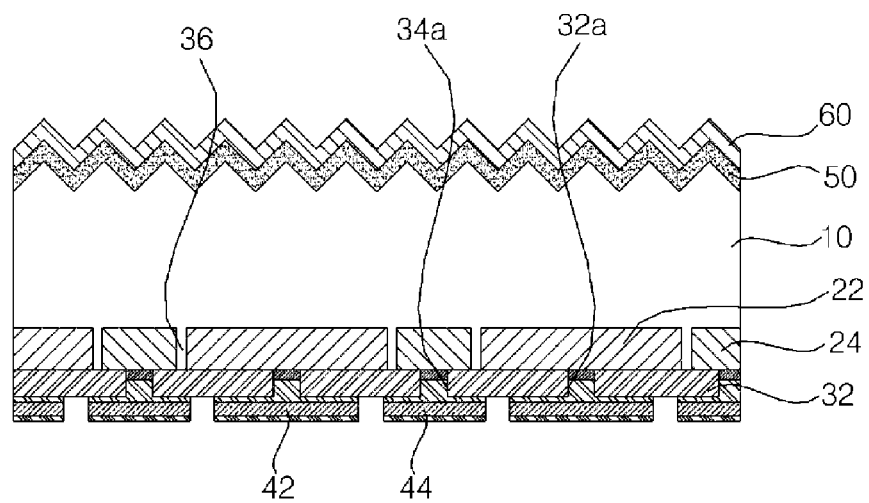

Subsequently, as shown in FIG. 2F, first and second electrodes 42 and 44 connected to the first and second conductive regions 22 and 24 are formed. A method of forming the first and second electrodes 42 and 44 will be described in more detail with reference to FIGS. 3A to 3F.

Figure 3A:
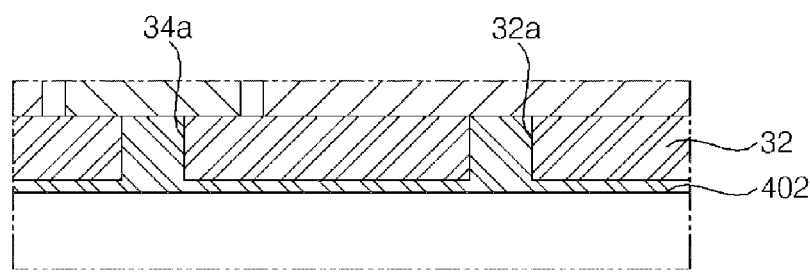
FIGS. 3A to 3F are sectional views showing a method of forming first and second electrodes of a solar cell according to an exemplary embodiment of the present invention.

First, as shown in FIG. 3A, a seed formation layer 402 is formed on the passivation film 32 to cover the semiconductor substrate 10 exposed through the contact holes 32*a* and 34*a* of the passivation film 32 (more specifically, the first and second conductive regions 22 and 24 formed at the semiconductor substrate 10). The seed formation layer 402 is a layer provided to form seed layers 422 and 442 and chemical bonding layers 422a and 442a (see FIG. 1) of this embodiment.

The seed formation layer 402 may be formed by electrolytic plating (for example, light organic plating or electrolytic plating using an electrolyte), non-electrolytic plating, or deposition (for example, physical vapor deposition, such as sputtering, or chemical vapor deposition). At this time, the seed formation layer 402 may be formed over the entirety of the passivation film 32 as well as the portion of the semiconductor substrate 10 exposed through the contact holes 32a and 34a. The seed formation layer 402 may be formed without additional patterning to simplify the manufacturing process. The seed formation layer 402 may include various metals which may react with the material or element constituting the semiconductor substrate 10 to form a compound. For example, the seed formation layer 402 may include Ni.

The seed formation layer 402 may have various thicknesses. For example, the seed formation layer 402 may have a thickness of about 10 nm to about 1 μm. If the thickness of the seed formation layer 402 is less than about 10 nm, the chemical bonding layers 422a and 442a may not be sufficiently formed or the seed formation layer 402 may not serve as a seed layer. On the other hand, if the thickness of the seed formation layer 402 is greater than about 1 μm, process time and cost may be increased. However, the present invention is not limited thereto.

Figure 3B:
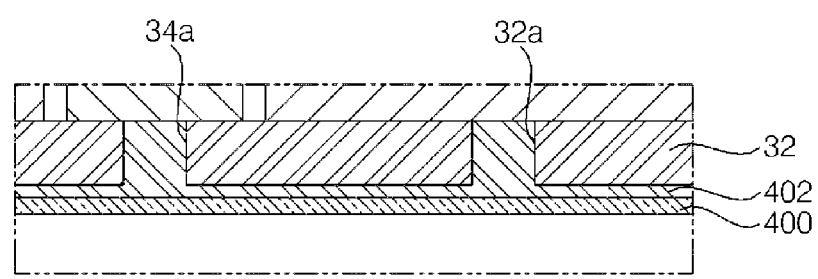

Subsequently, as shown in FIG. 3B, an anti-oxidation layer 400 is formed on the seed formation layer 402. The anti-oxidation layer 400 is a layer to prevent oxidation of the seed formation layer 402. The anti-oxidation layer 400 may include titanium (Ti), tantalum (Ta), tungsten (W), molybdenum (Mo), chromium (Cr), zinc (Zn), an alloy containing at least one thereof, or nitride containing at least one thereof. The anti-oxidation layer 400 may be formed on the entirety of the seed formation layer 402 without additional patterning to prevent oxidation of the entirety of the seed formation layer 402.

It is sufficient for the anti-oxidation layer 400 to have a thickness to prevent oxidation of the seed formation layer 402. For this reason, the anti-oxidation layer 400 may have a smaller thickness than the seed formation layer 402. As a result, it is possible to reduce manufacturing time and cost. At this time, a ratio of the thickness of the seed formation layer 402 to the thickness of the anti-oxidation layer 400 may be about 2:1 to about 200:1. If the ratio of the thickness of the seed formation layer 402 to the thickness of the anti-oxidation layer 400 is less than about 2:1, the thickness of the anti-oxidation layer 400 may be excessively increased. On the other hand, if the ratio of the thickness of the seed formation layer 402 to the thickness of the anti-oxidation layer 400 is greater than about 200:1, the anti-oxidation effect of the anti-oxidation layer 400 may not be sufficient. In order to further improve the anti-oxidation effect of the anti-oxidation layer 400, the ratio of the thickness of the seed formation layer 402 to the thickness of the anti-oxidation layer 400 may be about 2:1 to about 10:1. However, the present invention is not limited thereto.

For example, the anti-oxidation layer 400 may have a thickness of about 5 nm to about 100 nm. If the thickness of the anti-oxidation layer 400 is less than about 5 nm, the anti-oxidation effect of the anti-oxidation layer 400 may not be sufficient. On the other hand, if the thickness of the anti-oxidation layer 400 is greater than about 100 nm, time and cost necessary to form and remove the anti-oxidation layer 400 may be increased. However, the present invention is not limited thereto.

Figure 3C:
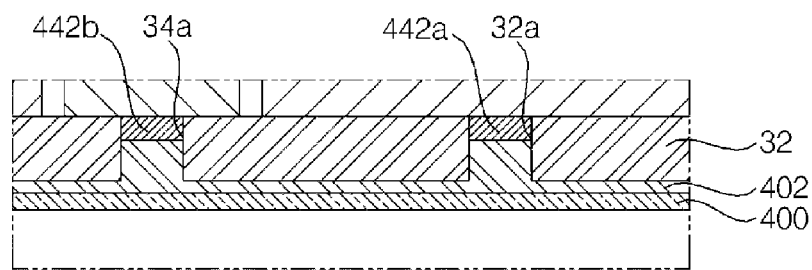

Subsequently, as shown in FIG. 3C, a thermal process is performed to form chemical bonding layers 422a and 442a in the contact holes 32a and 34a.

For example, thermal process temperature may be about 350° C. to about 450° C. If the thermal process temperature is less than about 350° C., the chemical bonding layers 422a and 442a may not be satisfactorily formed. On the other hand, if the thermal process temperature is greater than about 450° C., the chemical bonding layers 422a and 442a may be excessively formed and process cost may be increased due to such a high temperature process. In addition, the seed formation layer 402 may be satisfactorily plasticized within the above-defined thermal process temperature range.

Meanwhile, thermal process time may be about 5 minutes to about 1 hour. If the thermal process time is less than about 5 minutes, the chemical bonding layers 422a and 442a may not be satisfactorily formed. On the other hand, if the thermal process time is greater than about 1 hour, process cost may be increased. In addition, the seed formation layer 402 may be satisfactorily plasticized within the above-defined thermal process time range.

While the seed formation layer 402 is plasticized through the thermal process, the chemical bonding layers 422a and 442a are formed at the portions of the seed formation layer 402 contacting the semiconductor substrate 10. In addition, at the portions of the seed formation layer 402 contacting the semiconductor substrate 10, the material or element of the seed formation layer 402 and the material or element constituting the semiconductor substrate 10 react with each other to form a compound. As a result, the chemical bonding layers 422a and 442a including silicide are formed at the portions of the seed formation layer 402 adjacent to the semiconductor substrate 10 (more specifically, the first and second conductive regions 22 and 24 formed at the semiconductor substrate 10). In a case in which the seed formation layer 402 includes Ni, the chemical bonding layers 422a and 442a may include NiSi.

At this time, in this embodiment, the seed formation layer 402 is plasticized, in a state in which the anti-oxidation layer 400 is disposed on the seed formation layer 402, to form the chemical bonding layers 422a and 442a. As a result, it is possible to prevent deterioration in characteristics of the chemical bonding layers 422a and 442a and seed layers 422 and 442 due to oxidation of the seed formation layer 402 during the thermal process. That is, the seed formation layer 402 may be easily oxidized due to the thermal process time during the thermal process. In a case in which the seed formation layer 402 is oxidized, the chemical bonding layers 422a and 442a may not be satisfactorily formed or the characteristics of the chemical bonding layers 422a and 442a may be lowered. As a result, the characteristics of the seed layers 422 and 442 may also be lowered. In a case in which the seed formation layer 402 is plasticized in a state in which the anti-oxidation layer 400 is disposed on the seed formation layer 402 as in this embodiment, it is possible to effectively prevent oxidation of the seed formation layer 402. As a result, it is possible to prevent deterioration in characteristics of the chemical bonding layers 422a and 442a and the seed layers 422 and 442.

In addition, the seed formation layer 402 is plasticized before the conductive layers 424 and 444 and the capping layers 426 and 446 are formed. Consequently, it is possible to prevent the material of the conductive layers 424 and 444 from being diffused into the seed formation layer 402 (or the seed layers 422 and 442) when the conductive layers 424 and 444 and the capping layers 426 and 446 are formed.

Figure 3D:
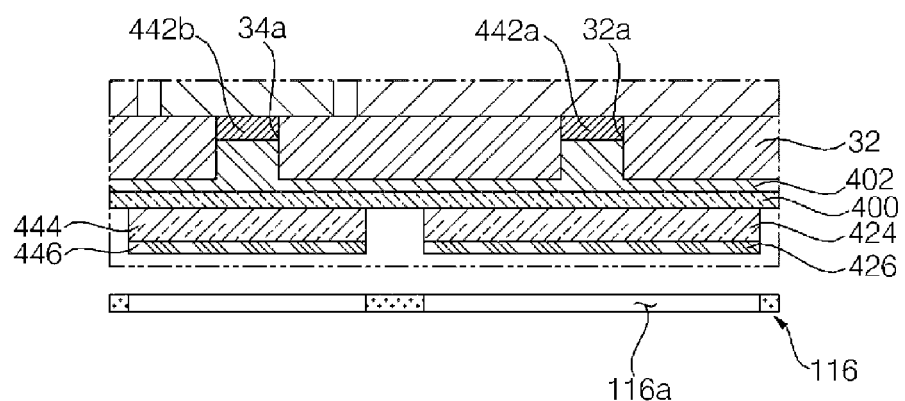

Subsequently, as shown in FIG. 3D, conductive layers 424 and 444 and capping layers 426 and 446 are sequentially formed on the seed formation layer 402 in a state in which a mask (for example, a shadow mask) 116 is masking the seed formation layer 402. The conductive layers 424 and 444 and the capping layers 426 and 446 may be formed using various methods. For example, the conductive layers 424 and 444 and the capping layers 426 and 446 may be formed by deposition, sputtering, etc. The conductive layers 424 and 444 and the capping layers 426 and 446 are formed only at portions of the seed formation layer 402 corresponding to openings 116a of the mask 116. As a result, the conductive layers 424 and 444 and the capping layers 426 and 446 are patterned on the seed formation layer 402.

In FIG. 3D, the mask 116 is shown as being used. However, the present invention is not limited thereto. For example, the mask 116 may include a resist layer formed on the seed formation layer 402 by photolithography. In a case in which the mask 116 includes a resist layer, the conductive layers 424 and 444 and the capping layers 426 and 446 may be formed using various methods, such as deposition, sputtering, electrolytic plating, and non-electrolytic plating. In this case, the mask 116 may be removed by etching, etc. after the conductive layers 424 and 444 and the capping layers 426 and 446 are formed.

For example, the conductive layers 424 and 444 may include Cu and the capping layers 426 and 446 may include Sn or TaN. However, the present invention is not limited thereto. The conductive layers 424 and 444 and the capping layers 426 and 446 may include various other materials.

The conductive layers 424 and 444 may include Cu and the capping layers 426 and 446 may be thicker than the seed formation layer 402. In addition, the conductive layers 424 and 444 may have a larger thickness than the capping layers 426 and 446. For example, the conductive layers 424 and 444 may have a thickness of about 20 μm to about 30 μm and the capping layers 426 and 446 may have a thickness of about 1 μm to about 10 μm. These thickness ranges are set to minimize process cost and time while the conductive layers 424 and 444 may include Cu and the capping layers 426 and 446 to sufficiently function.

Figure 3E:
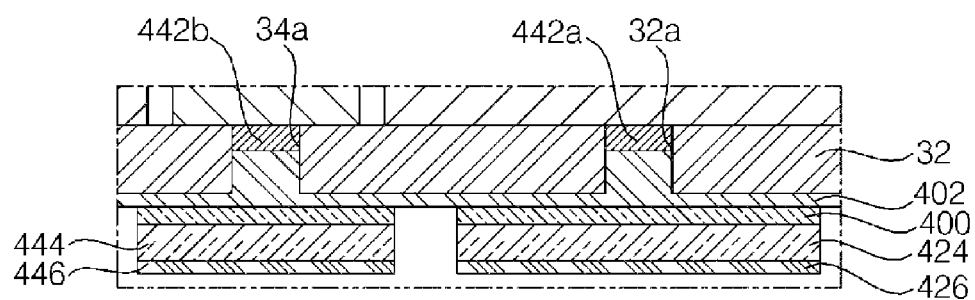

Subsequently, as shown in FIG. 3E, the anti-oxidation layer 400 exposed between the conductive layers 424 and 444 and the capping layers 426 and 446 of the first and second electrodes 42 and 44 is selectively etched using the conductive layers 424 and 444 and the capping layers 426 and 446 as a mask. At this time, the anti-oxidation layer 400 can be easily selectively etched without an additional mask since the conductive layers 424 and 444 and the capping layers 426 and 446 serve as the mask.

Various solutions that can etch only the anti-oxidation layer 400 without etching the conductive layers 424 and 444 and the capping layers 426 and 446 may be used as an etching solution. The etching solution may include various materials based on the material of the anti-oxidation layer 400. For example, in a case in which the anti-oxidation layer 400 includes titanium (Ti), a mixed solution of hydrofluoric acid, nitric acid, and ultrapure water or a mixed solution of hydrofluoric acid, hydrogen peroxide, and ultrapure water may be used as the etching solution. In a case in which the anti-oxidation layer 400 includes tantalum (Ta), a mixed solution of hydrofluoric acid and nitric acid may be used as the etching solution. In a case in which the anti-oxidation layer 400 includes tungsten (W), an etching solution including sulfuric acid or a mixed solution of aqueous ammonia and hydrogen peroxide may be used as the etching solution. In a case in which the anti-oxidation layer 400 includes chromium (Cr) or molybdenum (Mo), a mixed solution of hydrochloric acid and hydrogen peroxide may be used as the etching solution. In a case in which the anti-oxidation layer 400 includes zinc (Zn), a mixed solution of hydrochloric acid and water or a mixed solution of nitric acid and water may be used as the etching solution.

Figure 3F:
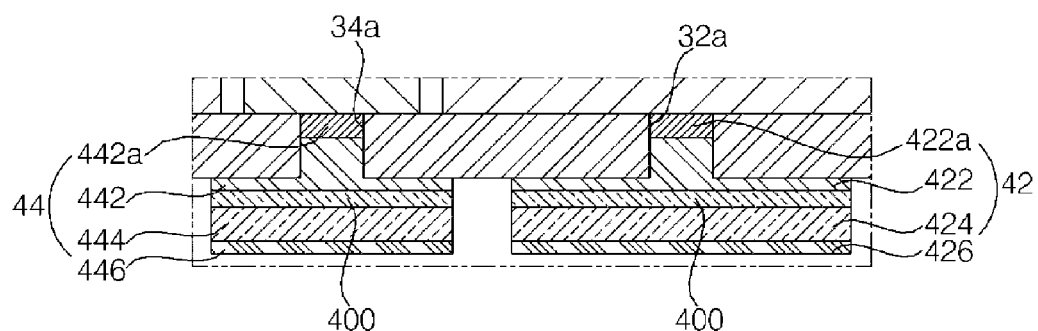

Subsequently, as shown in FIG. 3F, the seed formation layer 402 exposed (as seen in FIG. 3E) between the conductive layers 424 and 444 and the capping layers 426 and 446 of the first and second electrodes 42 and 44 is selectively etched using the conductive layers 424 and 444 and the capping layers 426 and 446 as a mask. At this time, the seed formation layer 402 can be easily selectively etched without an additional mask since the conductive layers 424 and 444 and the capping layers 426 and 446 serve as the mask.

Various solutions that can etch only the seed formation layer 402 without etching the conductive layers 424 and 444 and the capping layers 426 and 446 may be used as an etching solution. For example, a mixed solution of nitric acid, hydrochloric acid, and water may be used as the etching solution.

In this embodiment, the seed formation layer 402 is plasticized to form the seed layers 422 and 442 and the chemical bonding layers 422a and 442a in a state in which the anti-oxidation layer 400 is present before the conductive layers 424 and 444 and the capping layers 426 and 446 are formed. As a result, it is possible to prevent contamination or deformation of the seed layers 422 and 442 and the chemical bonding layers 422a and 442a when the conductive layers 424 and 444 and the capping layers 426 and 446 are formed. In addition, it is possible to prevent oxidation of the seed formation layer 402 when the seed formation layer 402 is plasticized, thereby improving bonding characteristics with the conductive layers 424 and 444 and the capping layers 426 and 446. That is, the first and second electrodes 42 and 44 may have excellent electrical characteristics, thereby improving characteristics of the solar cell 100.

In addition, the anti-oxidation layer 400 and the seed formation layer 402 are selectively patterned using the conductive layers 424 and 444 and the capping layers 426 and 446 as the mask. Consequently, it is possible to etch the anti-oxidation layer 400 and the seed formation layer 402 into a desired shape without using an additional mask.

In the above description, the back surface electrode type structure in which both the first and second electrodes 42 and 44 are disposed at the back surface of the semiconductor substrate 10 has been described by way of example. In the back surface electrode type structure, it is possible to maximize the quantity of light incident upon the front surface since both the first and second electrodes 42 and 44 are disposed at the back surface of the semiconductor substrate 10. As a result, it is possible to improve efficiency of the solar cell 100. However, the present invention is not limited thereto. For example, one of the first and second conductive regions 22 and 24 may be disposed at the front surface of the semiconductor substrate 10 and thus one of the first and second electrodes 42 and 44 may be disposed at the front surface of the semiconductor substrate 10.

In addition, in this embodiment, the structure in which the photoelectric conversion unit is applied to a silicon solar cell has been described by way of example. However, the present invention is not limited thereto. For example, the structure of the first and second electrodes 42 and 44 of this embodiment may be applied to an electrode structure of a solar cell (for example, a thin film solar cell) including a photoelectric conversion unit having another well-known structure. This falls within the scope of the present invention.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A manufacturing method of a solar cell comprising:
forming a photoelectric conversion unit;
forming a passivation film on the photoelectric conversion unit; and
forming an electrode connected to the photoelectric conversion unit, wherein the forming of the electrode comprises:
  forming contact holes formed through the passivation film;
  forming a metal layer connected to the photoelectric conversion unit, wherein the metal layer is formed on the passivation film to cover an exposed portion of the photoelectric conversion unit through the contact holes of the passivation film;
  forming an anti-oxidation layer on the metal layer to prevent oxidation of the metal layer;
  performing a thermal process such that a material of the metal layer and a material of the photoelectric conversion unit react with each other to form a chemical bonding layer at a portion at which the metal layer and the photoelectric conversion unit are adjacent to each other and a remaining portion of the metal layer cover the chemical bonding layer;
  forming a conductive layer and a capping layer on the metal layer in a state in which a mask is disposed on the metal layer; and
  patterning the metal layer using one of the conductive layer and the capping layer as a mask,
wherein the chemical bonding layer is formed in the contact holes of the passivation film.

2. The manufacturing method according to claim 1, wherein the anti-oxidation layer comprises metal.

3. The manufacturing method according to claim 2, wherein the anti-oxidation layer comprises at least one of titanium (Ti), tantalum (Ta), tungsten (W), molybdenum (Mo), chromium (Cr), zinc (Zn), an alloy containing at least one thereof, and nitride containing at least one thereof.

4. The manufacturing method according to claim 1, wherein the metal layer has a thickness of about 10 nm to about 1 μm.

5. The manufacturing method according to claim 1, wherein the anti-oxidation layer has a smaller thickness than the metal layer.

6. The manufacturing method according to claim 5, wherein a ratio of the thickness of the metal layer:the thickness of the anti-oxidation layer is about 2:1 to about 200:1.

7. The manufacturing method according to claim 6, wherein the ratio of the thickness of the metal layer:the thickness of the anti-oxidation layer is about 2:1 to about 10:1.

8. The manufacturing method according to claim 5, wherein the anti-oxidation layer has a thickness of about 5 nm to about 100 nm.

9. The manufacturing method according to claim 1, wherein the performing the thermal process comprises performing the thermal process at a thermal process temperature of about 350° C. to about 450° C.

10. The manufacturing method according to claim 1, wherein the performing the thermal process comprises performing the thermal process for a thermal process time of about 5 minutes to about 1 hour.

11. The manufacturing method according to claim 1, wherein the conductive layer has a thickness of about 20 μm to about 30 μm, and the capping layer has a thickness of about 1 μm to about 10 μm.

12. The manufacturing method according to claim 1, wherein the metal layer comprises nickel (Ni), and the chemical bonding layer comprises nickel silicide (NiSi).

13. The manufacturing method according to claim 1, wherein the conductive layer comprises copper (Cu), and the capping layer comprises tin (Sn).

14. The manufacturing method according to claim 1, wherein the patterning the metal layer comprises patterning the metal layer using an etching solution to selectively etch the metal layer.

15. The manufacturing method according to claim 14, wherein the etching solution comprises nitric acid and hydrochloric acid.

16. The manufacturing method according to claim 1, further comprising patterning the anti-oxidation layer using one of the conductive layer and the capping layer as a mask between the forming the conductive layer and the capping layer and the patterning the metal layer.

17. The manufacturing method according to claim 1, wherein the metal layer serves as a seed layer.

* * * * *